United States Patent [19]

Wukusick et al.

[11] 4,169,742

[45] Oct. 2, 1979

[54] CAST NICKEL-BASE ALLOY ARTICLE

[75] Inventors: Carl S. Wukusick, Cincinnati; Thomas Tom, West Chester; Leo Buchakjian, Jr., Fairfield, all of Ohio

[73] Assignee: General Electric Company, Cincinnati, Ohio

[21] Appl. No.: 842,698

[22] Filed: Oct. 17, 1977

Related U.S. Application Data

[63] Continuation-in-part of Ser. No. 751,317, Dec. 16, 1976, abandoned.

[51] Int. Cl.² .................................. C22C 19/05
[52] U.S. Cl. .................................. 148/32.5; 75/171
[58] Field of Search ............... 75/171, 170; 148/32, 148/32.5

[56] References Cited

U.S. PATENT DOCUMENTS

| | | | |
|---|---|---|---|
| 3,526,499 | 9/1970 | Quigg et al. | 75/171 |
| 3,887,363 | 6/1975 | Smashey et al. | 75/171 |

*Primary Examiner*—R. Dean
*Attorney, Agent, or Firm*—Lee H. Sachs; Derek P. Lawrence

[57] ABSTRACT

A cast nickel-base alloy article having a complex internal passage and a columnar grain structure is provided with an improved combination of castability and mechanical properties through a control of the amount of gamma prime phase and its related phase formers, a careful control of Co and Al along with Hf and a control of the gamma solution strengtheners, particularly Mo and W.

6 Claims, 2 Drawing Figures

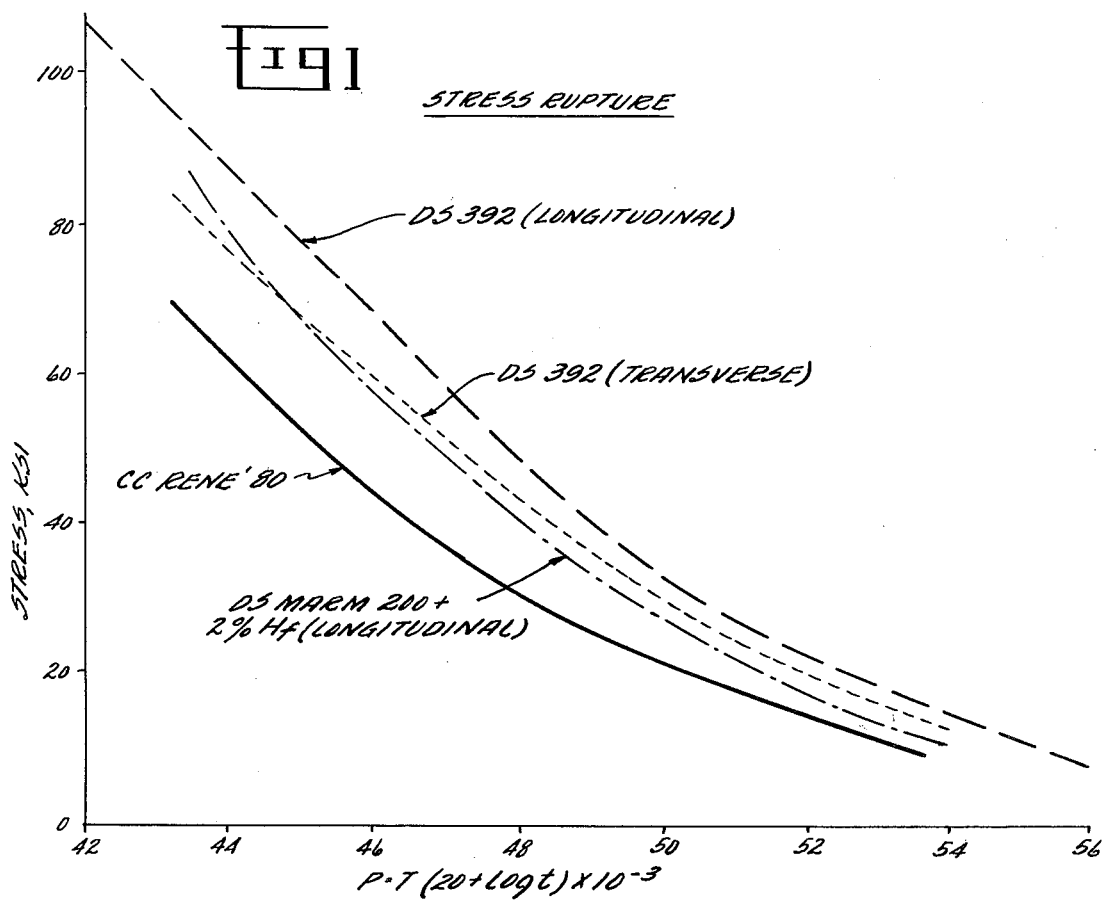
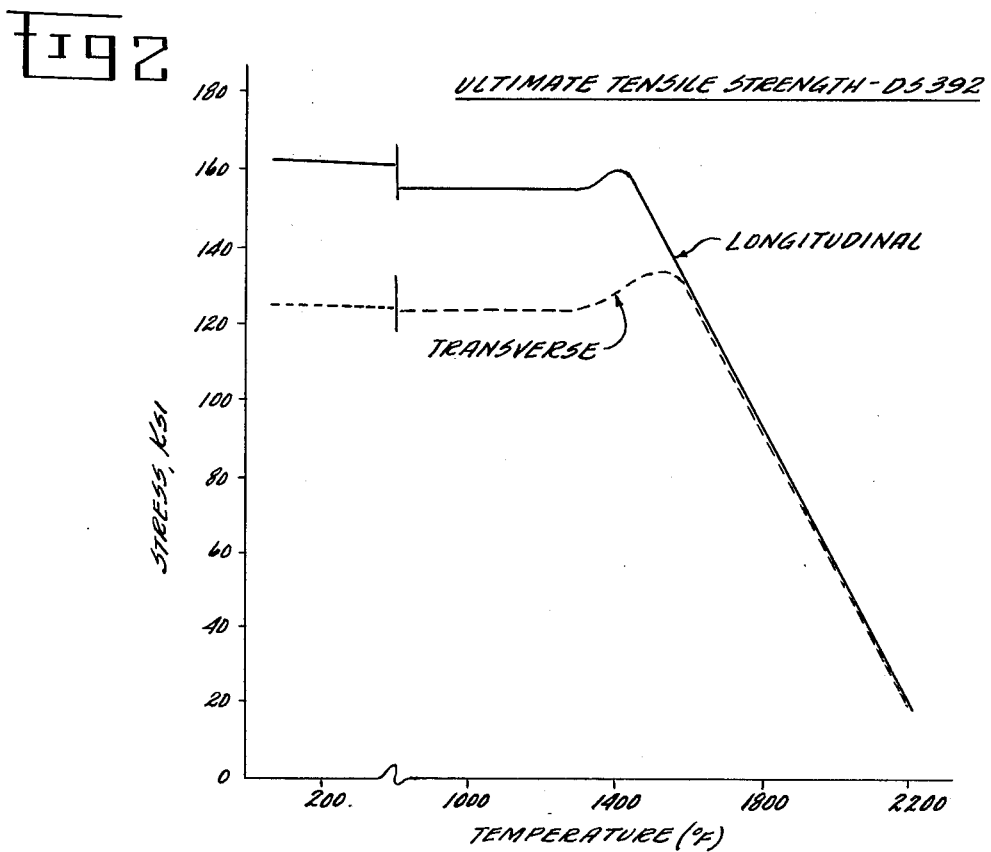

CAST NICKEL-BASE ALLOY ARTICLE

The Government has rights in this invention pursuant to Contract (or Grant) No. F33615-73-C-5050 awarded by the United States Air Force.

BACKGROUND OF THE INVENTION

This is a continuation-in-part of application Ser. No. 751,317, filed Dec. 16, 1976, abandoned and is assigned to the assignee of the present invention.

The present invention relates to a nickel-base alloy and cast article and, more particularly, to such an article having directionally oriented grain structure and an improved combination of castability and mechanical properties, particularly in the transverse direction.

In order to meet the higher alloy casting strength requirements in advanced gas turbine engines, it has been determined that directional orientation of the gain structure of such an article would be required. Such a structure is obtainable through several reported processes generally referred to as directional solidification (D.S.). As compared with conventional casting, directionally solidified alloy articles can provide increased life, improved ductility in the longitudinal direction and a significant improvement in thermal fatigue. However, in attempts to improve the strength of such alloys, problems relating to castability and certain mechanical properties, particularly in a transverse direction, have been recognized.

Although a number of Ni-base superalloys particularly useful in connection with directional solidification have been reported, they have been found to have certain undesirable characteristics for selected high temperature applications under difficult stress conditions. For example, the alloy described in U.S. Pat. No. 3,887,363—Smashey et al, while exhibiting high strength in the growth direction, was found to be limited in the transverse direction due to grain boundary weakness. Therefore, that alloy was found to be especially applicable and desirable in the form of single crystal articles, but not in the directional solidification casting of complex cored, multiple columnar grained turbine blades for advance jet engines because of excessive grain-boundary cracking. Such turbine blades, after removal of the cores, include complex internal air cooling passages or cavities. Marked improvements in castability were required.

SUMMARY OF THE INVENTION

It is a principal object of the present invention to provide an improved directionally oriented cast nickel-base alloy article having a complex internal passage or cavity and an improved combination of castability and mechanical properties.

It is another object to provide an alloy which can be directionally solidified into such an improved casting.

These and other objects and advantages will be more clearly understood from the following detailed description, the drawing and the specific examples which are intended to be typical of rather than in any way limiting on the scope of the present invention.

Briefly, one form of the alloy composition associated with the present invention and from which the improved air-cooled cast article is made consists essentially of, by weight, about 3–10% Cr, 10–13% Co, 5–6% Al, 5–7% Ta, up to about 2% Ti, up to about 2.5% V, 0.5–10% Re, about 3–7% W, 0.5–2% Mo, about 0.5–2% Hf, about 0.01–0.15% C, about 0.005–0.05% B, up to about 0.1% Zr, up to about 1% Cb, with the balance essentially nickel and incidental impurities, the alloy further characterized by the Co being about 11–13% when the Al is greater than about 5.5% or when the W is at least about 5% and the fact that it includes about 64–68 volume percent gamma prime phase.

For less complex air-cooled articles, the composition consists essentially of, by weight, 4–9% Cr, 10–13% Co, 5–6% Al, 5–7% Ta, up to about 2% Ti, up to about 2.5% V, 2–6% Re, 3–6% W, 0.5–2% Mo, about 0.5–2% Hf, about 0.01–0.1% C, about 0.005–0.05% B, up to about 0.1% Zr, up to about 1% Cb, with the balance Ni and incidental impurities, the Co being about 11–13% when the Al is greater than about 5.5% or when the W is at least about 5% and the gamma prime being in the range of about 64–68 volume percent.

For more complex air-cooled cast articles, such as turbine blades having very complex internal passages, a more specifically preferred alloy composition within the broad range consists essentially of, by weight, 4.5–5.5% Cr, 11.5–12.5% Co, 5.3–5.8% Al, 5.5–6.5% Ta, 1.5–2.5% V, 2.5–3.5% Re, 4.5–5.5% W, 0.5–1.5% Mo, 1.0–1.7% Hf, 0.04–0.08% C, 0.01–0.02% B, 0.01–0.05% Zr, with the balance essentially nickel and incidental impurities, including a maximum of about 0.1% Ti, the gamma prime being in the range of about 64–68 volume percent.

BRIEF DESCRIPTION OF THE DRAWING

FIG. 1 is a graphical comparison of stress rupture properties of a preferred form of the present invention (D.S. 392) with articles cast from current production alloys; and FIG. 2 is a graphical presentation of tensile strength of a preferred form of the present invention (D.S. 392).

DESCRIPTION OF THE PREFERRED EMBODIMENTS

In the evaluation of a variety of alloys for use in the manufacture of advanced turbine blades for gas turbine engines, the problem of decrease in castability with increasing mechanical properties was recognized. In particular, with some of the stronger alloys which had been cast in the directional solidification process, grain boundary cracking was observed. As a result of a number of evaluations, a castability rating system was selected as shown in the following Table I.

TABLE I

CASTABILITY RATINGS

A—No cracks
B—Minor crack at tip, less than ½" long or in starter zone
C—One major crack, greater than ½" long
D—Two or three cracks
E—Several cracks, more than 3 and less than 8
F—Many cracks—most grain boundaries The castability test with which such a rating system was associated employed a tubular crucible within which was placed a ceramic tube of smaller diameter, the lower one inch of which was slotted. This ceramic tube was held within the outer crucible by appropriate spacers. The alloy to be tested, in the form of a 7/16" diameter rod, was placed within the ceramic tube and the entire assembly was placed within apparatus capable of conducting directional solidification. Upon melting of the alloy charge rod, the molten charge filled the space between the outer tube or crucible and the ceramic tube, solidifying on the ceramic tube during directional solidification. After removal of the ceramic tube with the alloy deposited thereon, observations were made and the ratings were selected in accordance with Table I.

During the evaluation of the present invention, a wide variety of alloy compositions were melted and tested for castability and various mechanical, oxidation and corrosion properties. The following Table II shows the nominal compositions of alloys selected as typical of those melted and tested during the latter part of the program. Table III compares nominal gamma prime (γ′) content with castability and stress rupture strength. As used herein, the gamma prime content is determined by phase extractions which resulted in improved calculations for the determination of gamma prime using a computer program based on element partition.

TABLE II

NOMINAL COMPOSITION
Wt %: 5 Cr, 0.06 C, 0.015 B, 0.02–0.03 Zr,
Balance Ni and incidental impurities

| Alloy | Co | Al | Ta | V | Re | W | Mo | Hf | Ti | Calculated Nominal Γ′ (±1 Vol. %) |
|---|---|---|---|---|---|---|---|---|---|---|
| 341 | 3.5 | 5.8 | 8 | 2.5 | 3 | 3 | — | 1.1 | — | 67 |
| 381 | 3.5 | 5.5 | 7 | 2.2 | 3 | 3 | — | 1.5 | — | 63 |
| 383 | 3.5 | 5.5 | 6 | 2.2 | 3 | 3 | 1 | 1.5 | — | 62 |
| 385 | 3.5 | 5.5 | 6 | 2.2 | 3 | 4 | 1 | 1.5 | — | 63 |
| 386 | 3.5 | 5.5 | 6 | 2.2 | 3 | 5 | 1 | 1.5 | — | 64 |
| 391 | 7 | 5.5 | 6 | 2.2 | 3 | 5 | 1 | 1.5 | — | 65 |
| 392 | 10 | 5.5 | 6 | 2.2 | 3 | 5 | 1 | 1.5 | — | 66* |
| 394 | 10 | 5.8 | 8 | 2.5 | 3 | 3 | — | 1.2 | — | 68 |
| 397 | 8.5 | 5.5 | 6 | 2.2 | 3 | 5 | 1 | 1.5 | — | 65 |
| 398 | 8.5 | 5.5 | 6 | 2.2 | 3 | 4.5 | 1 | 1.5 | — | 63 |
| 399 | 8.5 | 5.5 | 6 | 2.2 | 3 | 5 | — | 1.5 | — | 64 |
| 423 | 10 | 5.5 | 6 | 2.2 | — | 8 | 1 | 1.5 | — | 66 |
| 424 | 10 | 5.5 | 6 | 1.1 | 3 | 5 | 1 | 1.5 | 1.1 | 68 |
| 425 | 10 | 5.5 | 6 | — | 3 | 5 | 1 | 1.5 | 2.1 | 70 |
| 392A | 12 | 5.5 | 6 | 2.2 | 3 | 5 | 1 | 1.5 | — | 66 |
| 428 | 10 | 5.8 | 6 | 1.6 | 3 | 5 | 1 | 1.5 | — | 66 |
| 433 | 12 | 5.8 | 6 | 1.6 | 3 | 5 | 1 | 1.5 | — | 66 |
| 434 | 14 | 5.8 | 6 | 1.6 | 3 | 5 | 1 | 1.5 | — | 66 |

* both phase extraction and calculation

TABLE III

STRENGTH AND CASTABILITY DATA

| D.S. Alloy | Nom. Vol. % Γ′ | Castability | Stress Rupture at 1650° F./60 ksi Life (hrs) | Condition |
|---|---|---|---|---|
| 341 | 67 | E | 170 | as D-S |
| 381 | 63 | A-B | 21 | as D-S |
| 383 | 62 | B | 15 | A |
| 385 | 63 | A-B | 92 | A |
| 386 | 64 | C-D | 178 | A |
| 391 | 65 | D-E | 368 | A |
| 392 | 66 | A-B | 234 | A |
| 394 | 68 | E-F | 134 | B |
| 397 | 65 | D-E | 162 | B |
| 398 | 63 | D-E | 201 | A |
| 399 | 64 | A-B | 81 | A |
| 423 | 66 | E | 112 | A |
| 424 | 68 | E | 242 | A |
| 425 | 70 | D-E | 208 | A |
| 392A | 66 | A | 200 | A, B |
| 428 | 66 | C-D | 182 | B |
| 433 | 66 | A-B | 177 | B |
| 434 | 66 | C | 194 | B |

Condition
A - Full solution heat treatment at 2350° F.
B - Partial solution heat treatment at 2200° F. for ½ hour In this group of alloys intended for casting by directional solidification, the grain boundary strengtheners C, B, Zr and Hf were maintained within the range of, by weight, about 1–2% Hf, 0.01–0.2% C, 0.01–0.05% B and up to 0.05% Zr in order to inhibit grain boundary cracking. Specifically selected for that phase of evaluation was the nominal range of about 0.06% C, 0.015% B and 0.03% Zr, with Hf being varied between 1.0–1.5%. In such alloy forms, Cr was maintained within the range of 3–10%, and more specifically about 5%; Re was maintained within the range of up to 10%, more specifically about 3%.

A comparison of the strength and castability data of Table III shows the critical effect of Co on castability. For example, alloys from 341 through 391 include Co in the range of up to 7 weight percent whereas the other alloys include Co in greater amounts. In the weaker alloys represented by 381, 383, 385 and 399, a higher degree of castability exists. However, when the gamma prime content of such alloys is increased above about 63%, in order to strengthen the alloy as shown by the increased stress rupture life, a significant change occurs in castability. The criticality of Co in the strengthening mechanism of the present invention is shown by a comparison of alloy forms 391, 392 and 392A wherein the only difference in composition is 7% Co in 391, 10% Co in 392 and 12% Co in 392A. Although alloy form 391 is better in stress rupture life, its castability is unacceptable. The unusual and unexpectedly critical range of Co in the present invention is clearly shown through a comparison of alloy forms 428, 433 and 434 in Tables II and III. Through evaluation of the present invention, it was found that castability can be affected by a small change in Al content while keeping the gamma prime content substantially the same, for example through adjustment of the V content. In order to depict the Co sensitivity, the series of alloy forms represented by alloys 428, 433 and 434 used as base including 5.8% Al and 1.6% V while maintaining other elements consistent with alloy 392, including a nominal gamma prime content at about 66 volume percent. As shown by the data of Table III, when the Al content is greater than about 5.5%, the Co must be greater than 10% in order to maintain the type of castability required in complex air-cooled articles such as turbine blades. As shown by those data of Table III a preferred nominal content of Co is about 12%, with 14% Co in alloy 434 resulting in significantly reduced castability. Therefore, the present invention defines the critical cobalt range as being about 11–13% when the Al content is greater than about 5.5%. Such a drastic change in castability from such a small change either in Co or Al was not known to be predictable before the present invention.

In addition, when W in the range of about 5–7 wt. % along with 1 wt. % Mo is included, a significantly greater than expected amount of Co is required. For this reason, the alloy composition associated with the present invention specifies that because Mo is included, cobalt in the range of about 11-13% is required for improved castability with 5-7% W. However, even at the higher levels of Co within the scope of the present invention, the inclusion of large amounts of gamma prime strengthening elements such as Al, Ta and V to produce a gamma prime content of about 68% or greater, results in an alloy of poor castability. This is shown by a comparison of alloys 392 and 394. The element W is included within the range of about 3-7 wt. % because at least about 3% is needed for strength and levels greater than about 7% decreases castability below acceptable limits in the presence of about 5-7% Ta and also results in an unstable alloy.

A review of some of the data of Tables II and III might lead one to the conclusion that it would be better to eliminate Mo because of its adverse effect on castability. However, a comparison between alloys 392, 398 and 399 shows the significant effect a small amount of Mo can have on the stress rupture properties of the alloy associated with the present invention. Therefore, the element Mo has been included within the range of 0.5-2 wt. % and preferably 0.5-1.5% so long as Co is maintained in the range of about 10-13%.

The element C is included in the present invention in the range of about 0.02-0.15 wt. %. Higher carbon content tends toward formation of excessive "script" type carbides and can reduce fatigue properties. It functions as a grain boundary strengthener and tends to improve castability.

Thus, it can be seen that, in respect to the combination of strength and castability in alloys intended for use in making directionally solidified, columnar grained cast articles which can be prone to cracking due to complex internal cavities, an unusual and unexpected array of criticalities exist. The present invention defines such an improved directionally oriented cast nickel-base superalloy article having an improved combination of castability and mechanical properties as a result of adherence to the alloy composition range associated with the present invention.

Specifically preferred within the scope of the present invention for the above-described directionally solidified cast articles of a complex, cored configuration is the nominal composition shown for alloy form 392A which is representative of the preferred range of 4.5-5.5% Cr, 11.5-12.5% Co, 5.3-5.8% Al, 5.5-6.5% Ta, 1.5-2.5% V, 2.5-3.5% Re, 4.5-5.5% W, 0.5-1.5% Mo, 1.0-1.7% Hf, 0.04-0.08% C, 0.01-0.02% B, 0.01-0.05% Zr with the balance essentially Ni and incidental impurities, the alloy further characterized by the fact that it contains gamma prime within the range of 64-68 vol. %.

The improved stress rupture properties of a directionally solidified article within the scope of the present invention is shown in graphical presentation of FIG. 1 which compares the present invention with two commercially available alloys used in gas turbine engine production. A first is a directionally solidified article made from an alloy sometimes identified as MAR-M200+Hf and having a nominal composition, by weight, of 0.15% C, 9% Cr, 10% Co, 12% W, 5% Al, 2% Ti, 1% Cb, 2% Hf, 0.015% B, 0.05% Zr, with the balance essentially Ni; a second is a conventionally cast article of Rene' 80 alloy having a nominal composition, by weight, of 0.17% C, 14% Cr, 9.5% Co, 4% Mo, 4% W, 5% Ti, 3% Al, 0.015% B, 0.03% Zr, with the balance essentially Ni. As is seen from FIG. 1, a directionally solidified article from the D.S. alloy 392 associated with the present invention has significantly better stress rupture properties than do such commercial, production alloys in the D.S. and in the conventionally cast (CC) conditions. The presentation of FIG. 1 is in the conventional Larsen-Miller parameter form well known and widely used in the art.

Thus, through an unusual and unexpected balance of elements, the present invention in one form provides an alloy capable of being manufactured into a directionally solidified cast article having an unusual combination of casting capability and stress rupture properties. At the same time, it maintains other adequate properties, for example tensile properties, as shown in the graphical presentation of FIG. 2. As was indicated above, the elements Hf, C, B and Zr were included within the specified range for their effect on grain boundary properties. For example, C is included to improve grain boundary and transverse properties; B is included to strengthen grain boundaries; Hf is included for its effect on grain boundary solidification and Zr is included because of its effect on grain boundary properties, although its effect is less pronounced that Hf, C and B.

Cobalt has been included in a particularly critical range for its effect on castability in combination with the strengthening elements W and Mo. W, about half of which partitions as a gamma prime former, has a tendency to improve castability and maintain equivalent strength. Conversely, Mo tends to decrease castability, although it helps maintain strength because it, also, partitions about half to form gamma prime. The unusual and unexpected interrelationship between the amounts of W, Mo and Co, discussed in connection with the above Tables II and III, helps provide the unusual characteristics of the present invention.

The element Cb can be included as a partial substitute for Ta up to about 1 wt. % Cb, although the presence of Cb is not preferred because of its tendency to reduce melting temperature more rapidly than Ta.

As described in U.S. Pat. No. 3,887,363—Smashey et al, the disclosure of which is incorporated herein by reference, Re acts as a solid solution strengthener in the type of Ni-base superalloy to which the present invention relates. It is included within the range of about 0.5-10 wt. % in the present invention.

As was mentioned above, increasing the amount of gamma prime increases strength because gamma prime is the precipitate hardening phase. However, as the gamma prime is increased, the amount of eutectic increases and castability decreases so that the present invention recognizes the criticality of maintaining gamma prime in the range of about 64-68 vol. % even though the trend in design of superalloys is to increase the amount of gamma prime to even higher levels. Similarly, many modern superalloys include substantial amounts of Cr for its effect on oxidation resistance. However, the present invention recognizes that, although less than about 3% Cr is too little for adequate oxidation resistance, greater than about 10 wt. % affects stability and tends to decrease strength in the present invention.

The principal gamma prime formers in the alloy are Al, Ta and V, with, at most, very small amounts of Ti. The Al content must be high enough to stabilize the $Ni_3Al$ (gamma prime) structure. Additions of Ta, V and Ti substitute for Al and, as a result, strengthen the structure. Ta and V are preferred over Ti because Ti segregates the dendrite ends more so than do Ta and V, leading to the formation of large amounts of eutectic.

This results in reduced castability. Substitution of Ti for V in the alloy caused reduction in castability and, at about 2% Ti, a reduction in strength, as shown in the following Table IV. Therefore, Ti is not a preferred addition. However, if the V content is decreased, up to about 2 wt. % Ti can be tolerated for some applications as less complex cast articles.

Vanadium is limited to about 2.5% in the alloy because larger amounts tend to reduce the oxidation and hot corrosion resistances.

In one evaluation, comparison of stress rupture strength and castability was made for variations of W and Re, in an attempt to eliminate Re, substituting more W. The data of Table V shows castings of D.S. alloy form 423 with 8 wt. % W and 0% Re to have low stress rupture properties and poor castability as compared with castings of D.S. alloy form 392, preferred within the scope of the present invention.

TABLE IV

| Alloy | Wt. % V | Wt. % Ti | Castability | Stress Rupture Strength at 1800° F./35 ksi - Life (hrs.) |
|---|---|---|---|---|
| 392 | 2.2 | — | A-B | 130 |
| 424 | 1.1 | 1.1 | E | 124 |
| 425 | — | 2.1 | D-E | 87 |

TABLE V

| Alloy | Wt. % Re | Wt. % W | Vol. % γ' | Castability | Stress Rupture Strength at 1650° F./60 ksi - Life(hrs.) |
|---|---|---|---|---|---|
| 392 | 3 | 5 | 66 | A-B | 234 |
| 423 | — | 8 | 66 | E | 112 |

Although the present invention has been described in connection with specific examples and embodiments, it will be recognized by those skilled in the art the variations and modifications of which the present invention is capable. It is intended to include within the scope of the appended claims such variations and modifications.

What is claimed is:

1. An improved cast nickel-base alloy article having a complex internal passage, a columnar grain structure and improved castability and stress rupture properties as a result of its being made from an alloy consisting essentially of, by weight, 3–10% Cr, 10–13% Co, 5–6% Al, 5–7% Ta, up to about 2% Ti, up to about 2.5% V, about 0.5–10% Re, about 3–7% W, 0.5–2% Mo, about 0.5–2% Hf, about 0.01–0.15% C, about 0.005–0.05% B, up to about 0.1% Zr, up to about 1% Cb with the balance essentially Ni and incidental impurities, the alloy further characterized by the Co being about 11–13% when the Al is greater than about 5.5% or when the W is at least about 5%, and including about 64–68 vol. % gamma prime phase.

2. The cast article of claim 1 in which, in the alloy, by weight, the Cr is 4–9%, the Re is 2–6%, the W is 3–6% and the C is 0.01–0.1%.

3. The cast article of claim 2 in which the alloy consists essentially of, by weight, 4.5–5.5% Cr, 11.5–12.5% Co, 5.3–5.8% Al, 5.5–6.5% Ta, 1.5–2.5% V, 2.5–3.5% Re, 4.5–5.5% W, 0.5–1.5% Mo, 1.0–1.7% Hf, 0.04–0.08% C, 0.01–0.02% B, 0.01–0.05% Zr, with the balance essentially Ni and incidental impurities, the gamma prime content being in the range of about 64–68 vol. %.

4. An improved nickel-base superalloy particularly useful in the casting of a directionally solidified article including a complex internal passage, the alloy consisting essentially of, by weight, 3–10% Cr, 10–13% Co, 5–6% Al, 5–7% Ta, up to about 2% Ti, up to about 2.5% V, about 0.5–10% Re, about 3–7% W, 0.5–2% Mo, about 0.5–2% Hf, about 0.01–0.15% C, about 0.005–0.05% B, up to about 0.1% Zr, up to about 1% Cb with the balance essentially Ni and incidental impurities, the alloy further characterized by the cobalt being about 11–13% when the Al is greater than about 5.5% or when the W is at least about 5% and including about 64–68 vol. % gamma prime phase.

5. The alloy of claim 4 in which, by weight, the Cr is 4–9%, the Re is 2–6%, the W is 3–6% and the C is 0.01–0.1%.

6. The alloy of claim 5 which consists essentially of, by weight, 4.5–5.5% Cr, 11.5–12.5% Co, 5.3–5.8% Al, 5.5–6.5% Ta, 1.5–2.5% V, 2.5–3.5% Re, 4.5–5.5% W, 0.5–1.5% Mo, 1.0–1.7% Hf, 0.04–0.08% C, 0.01–0.02% B, 0.01–0.05% Zr, with the balance essentially Ni and incidental inpurities, the gamma prime content being in the range of about 64–68 vol. %.

* * * * *